(12) United States Patent
Sterken et al.

(10) Patent No.: US 12,456,641 B2
(45) Date of Patent: Oct. 28, 2025

(54) METHOD FOR POSITIONING COMPONENTS ON A SUBSTRATE AND SUBSTRATES SUITABLE FOR THE METHOD

(71) Applicants: IMEC VZW, Leuven (BE); Universiteit Gent, Ghent (BE)

(72) Inventors: Tom Sterken, Merelbeke (BE); Geert Van Steenberge, Sint-Amandsberg (BE)

(73) Assignees: IMEC VZW, Leuven (BE); Universiteit Gent, Ghent (BE)

( * ) Notice: Subject to any disclaimer, the term of this patent is extended or adjusted under 35 U.S.C. 154(b) by 461 days.

(21) Appl. No.: 18/000,551

(22) PCT Filed: Jun. 23, 2021

(86) PCT No.: PCT/EP2021/067266
§ 371 (c)(1),
(2) Date: Dec. 2, 2022

(87) PCT Pub. No.: WO2022/002733
PCT Pub. Date: Jan. 6, 2022

(65) Prior Publication Data
US 2023/0290664 A1      Sep. 14, 2023

(30) Foreign Application Priority Data

Jun. 29, 2020   (EP) .................................... 20182867

(51) Int. Cl.
*H01L 21/683*      (2006.01)
*B23K 26/0622*    (2014.01)
(Continued)

(52) U.S. Cl.
CPC ...... *H01L 21/6835* (2013.01); *B23K 26/0622* (2015.10); *B23K 26/073* (2013.01);
(Continued)

(58) Field of Classification Search
CPC ....... H01L 21/6835; H01L 2221/68354; H01L 2221/68368; H01L 2221/68381;
(Continued)

(56) References Cited

U.S. PATENT DOCUMENTS 10,748,802 B2 * 8/2020 Marinov ................. H01L 24/83
11,942,354 B2 * 3/2024 Marinov ........... H01L 21/67144
(Continued)

FOREIGN PATENT DOCUMENTS

WO    2012142177 A2    10/2012
WO    2012142177 A3     2/2013
(Continued)

OTHER PUBLICATIONS

International Searching Authority; PCT International Search Report and Written Opinion of the International Searching Authority for International Application No. PCT/EP2021/067266, mailed Sep. 16, 2021, 9 pages.
(Continued)

*Primary Examiner* — Vu A Vu
(74) *Attorney, Agent, or Firm* — McDonnell Boehnen Hulbert & Berghoff LLP

(57) ABSTRACT

A method for accurately positioning a component on a receiver substrate is provided. The component is transferred from a donor substrate to a receiver substrate facing the donor substrate. The method comprises creating at least one nozzle at a predefined location in the area of contact between a blister forming layer on the donor substrate, and a component attached to the donor substrate by adhesion to the blister forming layer. The blister forming layer comprises at least a dynamic release layer, consisting of a dynamic release material. The application of the laser beam creates a blister that contains vaporized dynamic release material. The blister expands until a nozzle is created, the nozzle allowing (Continued)

the vaporized dynamic release material to exit the blister and cause the release of the component and its propulsion towards the receiver substrate. The nozzle releases the material in the form of a narrow jet of gas.

22 Claims, 11 Drawing Sheets

(51) Int. Cl.
*B23K 26/073* (2006.01)
*B23K 26/57* (2014.01)
*H10H 20/857* (2025.01)
*H10H 20/01* (2025.01)

(52) U.S. Cl.
CPC .......... *B23K 26/57* (2015.10); *H10H 20/857* (2025.01); *H01L 2221/68354* (2013.01); *H01L 2221/68368* (2013.01); *H01L 2221/68381* (2013.01); *H10H 20/0364* (2025.01)

(58) Field of Classification Search
CPC . H01L 2221/68318; H01L 2221/68363; H01L 2224/83005; H01L 2224/83192; H01L 2224/95; H01L 2224/95136; B23K 26/0622; B23K 26/073; B23K 26/57; H10H 20/857; H10H 20/0364; H10H 20/01
USPC ........................................................ 438/26
See application file for complete search history.

(56) References Cited

U.S. PATENT DOCUMENTS

2006/0081572 A1 4/2006 Weekamp et al.
2014/0238592 A1* 8/2014 Marinov .............. B32B 37/025 156/272.8

FOREIGN PATENT DOCUMENTS

WO 2012033147 A1 1/2014
WO 2016022528 A1 2/2016

OTHER PUBLICATIONS

Natallia S. Karlitskaya, Johan Meijer, Dirk F. De Lange, and Henk Kettelarij; "Laser propulsion of microelectronic components: releasing mechanism investigation." In High-Power Laser Ablation VI, Proc. of SPIE, vol. 6261, 62612P, 2006.

* cited by examiner

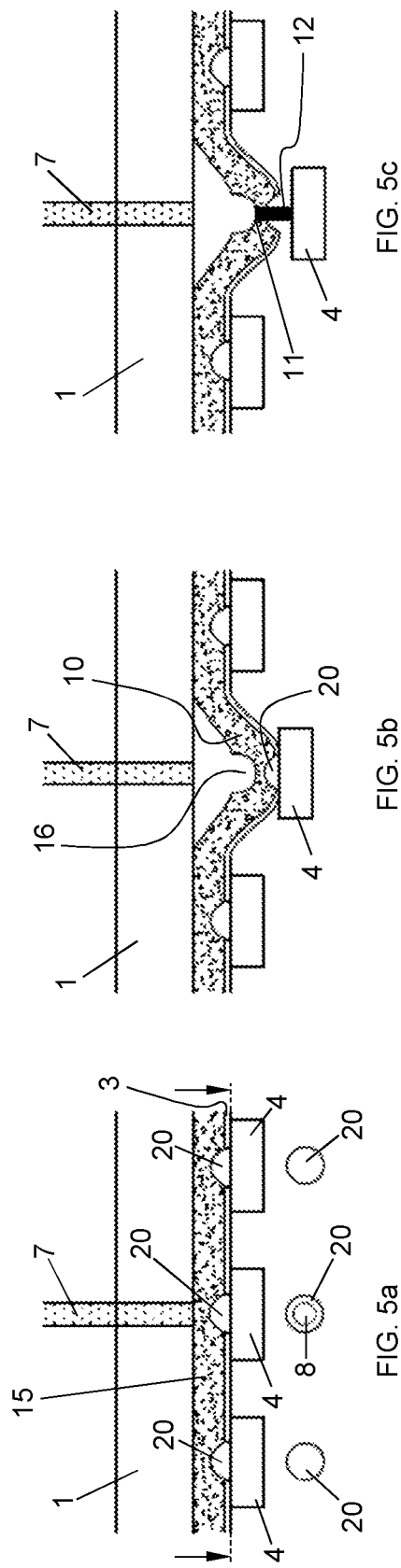
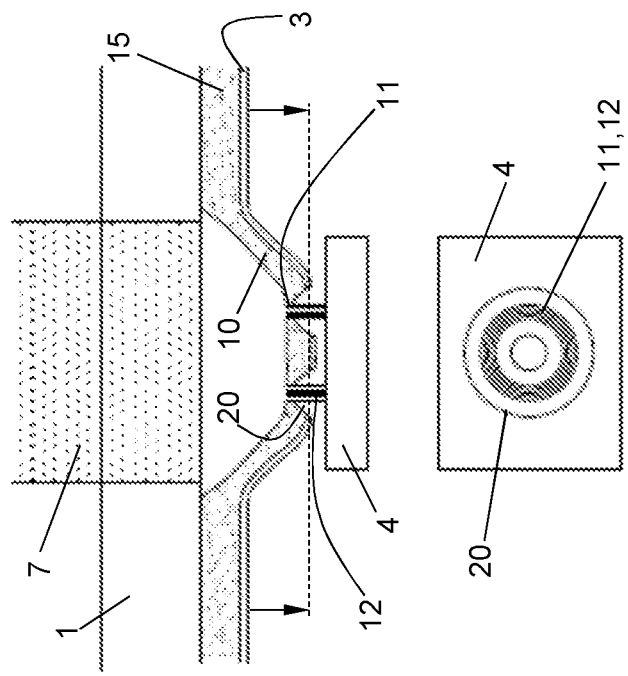
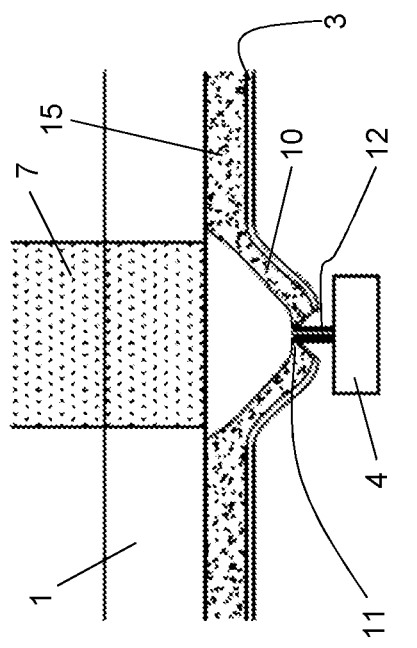

METHOD FOR POSITIONING COMPONENTS ON A SUBSTRATE AND SUBSTRATES SUITABLE FOR THE METHOD

REFERENCE TO RELATED APPLICATION

This application is a submission under 35 U.S.C. § 371 of international application no. PCT/EP2021/067266, filed Jun. 23, 2021. International application no. PCT/EP2021/067266 claims priority to European Patent Application No. 20182867.0, filed Jun. 29, 2020.

FIELD

The present disclosure is related to the assembly of small components such as micro-electronic components or micro-electronic chips on a substrate. The present disclosure is more in particular related to the assembly and accurate positioning of small components on a substrate using a laser assisted transfer technique.

BACKGROUND

For positioning electronic chips on a carrier substrate, various techniques are known, such as the pick-and-place approach or the flip-chip approach. For very small components, such as chips having planar dimensions below 100 μm, the required absolute placement accuracy increases to such a degree that the above methods are no longer cost-effective for high-throughput processing, because the speed of these methods decreases with placement accuracy.

A technique which has been developed specifically for small components is known as Laser Induced Forward Transfer (LIFT). According to this technique the components are attached to a donor substrate. On the front surface of the donor substrate is a so-called dynamic release layer (DRL) to which the components are attached by an adhesive, unless the DRL has itself adhesive properties, in which case the components are attached directly to the DRL. The donor substrate is transparent to laser light of at least one or more specific frequencies. The donor substrate is aligned and positioned parallel to a receiver substrate with the components facing towards the receiver substrate, and a pulsed laser beam at one of the specific frequencies is directed to the back side of the donor substrate, at the location of a component. The laser pulse traverses the transparent donor substrate but not the DRL, the latter being non-transparent to the laser light. The DRL material is chosen such that the laser energy is absorbed by the material, transforming it into a gas at high pressure and temperature, that effectively releases the component from the donor substrate and projects it toward the receiver substrate. Depending on a number of parameters such as the laser power, the thickness of the DRL and the material of the DRL, the DRL may be completely vaporized at the location of the component, in which case the pressure of the expanding gas propels the component towards the receiver. Due to the high pressures occurring and due to several uncontrollable boundary conditions, the control over the component's position is however very difficult in this case. This basic LIFT technique is described for example in patent application publication number US 2006/0081572. A particular difficulty is that the gas formation exerts not only a thrust force on the component in the direction of the receiver substrate, but also transversal drag forces which tend to divert the component from its desired trajectory. Generally, the effective direction of the force which is exerted on the component depends on many parameters and is very sensitive to variations in the process. It is considered to be uncontrollable in the above-described basic LIFT technique.

A better control is obtainable by the LIFT method described for example in patent application publication number WO 2012/142177. In this approach the DRL is not fully vaporized, and the gas forms a blister of the remaining DRL material. The blister expands, thereby stretching the adhesive. The blister is thereby inflated, and the mass of the component creates momentum, and the component is peeled off from the adhesive as the blister becomes larger. Once the expansion of the blister comes to an equilibrium, the momentum tears the component away from the adhesive, thereby releasing the component and propelling it towards the receiver substrate. However, as the mass of ultra-small and thin components decreases due to their smaller lateral dimensions, the momentum of such components is insufficient for the required release. Higher laser power could be used, but this is likely to cause the blister to burst in an uncontrolled way, which will again lead to the uncontrolled propulsion of the component and the loss of placement accuracy as described above. Increasing the thickness of the DRL in order to enable higher laser power without bursting could be considered, but this would increase the size of the blister in the plane of the donor substrate.

Another problem related to the difficulty of controlling the transfer using existing LIFT techniques, is that a reliable transfer can only be obtained for small air gaps between the component to be transferred and the receiver substrate. Therefore, the air gap is limited to about 50 micrometers (μm) in many cases. When components need to be transferred to a substrate having a given topography, for example caused by previously transferred chips, or when components of various thicknesses need to be transferred, it may become necessary to increase the air gap, which is often impossible without excessive loss of the directionality of the transferred components.

SUMMARY

The disclosure pertains to example embodiments in the form of a method that allows a more accurate positioning of small and/or thin components, with good controllability and good reliability, at high throughput.

According to the method of the present disclosure, a nozzle location is predefined in a contact area between a blister forming layer produced on a transparent donor substrate and a component attached to the donor substrate. The component may be attached to the donor substrate by adhering it to the blister forming layer through an adhesive layer or it may be attached directly to the blister forming layer if the blister forming layer itself has adhesive properties. The component, for example an electronic chip, is to be positioned on a receiver substrate facing the donor substrate. The blister forming layer comprises at least a dynamic release layer (DRL). This is a layer consisting of dynamic release material. i.e., material that is vaporized when a pulsed laser beam of a given wavelength and flux density is directed to the donor substrate at the location of the component, from the back side of the donor substrate. The dynamic release layer may be a continuous (non-patterned) layer, or it may be a patterned layer. The application of the pulsed laser beam or multiple pulsed laser beams having the properties required to vaporize the dynamic release material thus creates a blister that contains vaporized dynamic release material. The blister expands until the nozzle is created at the predefined location, the nozzle allowing the vaporized dynamic release material to exit the blister and cause the release of the component and its propulsion towards the receiver substrate.

The nozzle is an opening that is narrow compared to the dimensions of the contact area between the blister forming layer and the component. The nozzle therefore releases a narrow jet of vaporized dynamic release material. The jet fully releases the component, which may already be partially released through the expansion of the blister, and propels the component towards the receiver substrate with a high degree of directionality in a well-controlled way, due to the narrowness of the jet combined with the well-defined position of the nozzle. The description thereby pertains to the problem of the loss of directionality in LIFT-techniques and, the effective release of the component, even when the latter is very small or thin. Due to the improved directionality a more accurate positioning of the component is obtained, even for very small or thin components. Due to the improved directionality, the description also describes the application of a larger air gap between the donor substrate and the receiver substrate, compared to existing LIFT-based techniques.

The blister forming layer may be a stack of a DRL and a non-vaporizing layer, the latter being a layer that is able to form a blister when the dynamic release material underneath it is vaporized, but that does not itself vaporize under the influence of the laser pulse of the pulsed laser beam.

The nozzle location may be defined by the laser itself, for example by tuning the diameter of the laser beam relative to the surface of the area of contact, so that vaporization of the DRL takes place in an area that is small relative to the contact area. According to other embodiments, possibly combined with the previous embodiment, the nozzle location is defined by features integrated in the assembly of the donor substrate and the component, for example by patterning the DRL and/or by producing one or more local indentations and/or reinforcements in the contact area between the component and the blister forming layer.

The description also provides for an example embodiment in the form of a method for positioning a component, such as a micro-component, on a receiver substrate. The method comprises providing a donor substrate. The method also comprises producing a blister forming layer on the donor substrate. The blister forming layer can comprise a single layer or a stack of sublayers. The blister forming layer can comprise at least a dynamic release layer. The method also comprises attaching the component to the donor substrate by adhering the component to the blister forming layer either directly or through an adhesive layer, so that the component is in direct contact with the blister forming layer or via the adhesive layer across a contact area. The contact area can cover the whole or a portion of the dynamic release layer. The method further comprises positioning the donor substrate substantially parallel to the receiver substrate, with the component facing the receiver substrate. The receiver substrate comprises on its surface facing the donor substrate an adhesive receiving layer. The method further comprises directing a pulsed laser beam to the back side of the donor substrate (i.e., to the side of the donor substrate facing away from the receiver substrate) with a footprint of the pulsed laser beam at the location of the component (i.e., at a location within the contact area between the component and the blister forming layer). The pulsed laser beam causes vaporization of at least part of the dynamic release layer, thereby creating a blister containing vaporized material of the dynamic release layer (vaporized dynamic release material). The blister can expand until at least one nozzle is created at a predefined location within the contact area. The at least one nozzle allows the vaporized dynamic release material to exit the blister, thereby producing a jet of vaporized material, and causes the release of the component and its propulsion towards the receiver substrate. As a result, the component is positioned on the receiver substrate and attached to the receiver substrate by adhesion to the adhesive receiving layer.

According to an embodiment, the predefined location of the at least one nozzle is defined by applying a pulsed laser beam having a cross section that is considerably smaller than the contact area, and directing the pulsed laser beam at a spot within the contact area, so that the at least one nozzle is created at the position of the spot.

According to an embodiment, multiple pulsed laser beams are directed at multiple spots within the contact area, to thereby create multiple nozzles.

According to an embodiment, the predefined location of the at least one nozzle is defined by the location of at least one indentation in the blister forming layer, in the surface of the blister forming layer opposite the surface of the blister forming layer facing the donor substrate. i.e., in the surface of the blister forming layer opposite the surface by which the blister forming layer is attached to the donor substrate, the at least one indentation being positioned within the contact area.

According to an embodiment, at least one indentation is a point-type indentation, resulting in at least one nozzle producing a line-shaped jet of vaporized material, or at least one indentation is a line-type indentation, resulting in at least one nozzle producing a sheet-shaped jet of vaporized material.

According to an embodiment, the predefined location of at least one nozzle is defined by the location of at least one reinforcing element present on the surface of the blister-forming layer opposite the surface of the blister forming layer facing the donor substrate. i.e., on the surface of the blister forming layer opposite the surface by which the blister forming layer is attached to the donor substrate, and the at least one reinforcing element comprises an open area and reinforcing material around the open area, so that the predefined location of the at least one nozzle corresponds to the location of the open area.

According to an embodiment, at least one reinforcing element is a plate-shaped element formed of a reinforcing material, obtainable by depositing a layer of the reinforcing material on the blister forming layer and patterning the layer of reinforcing material, before attaching the component to the donor substrate.

The reinforcing material may be a metal.

According to an embodiment, the blister forming layer is a dynamic release layer. i.e., a layer consisting of dynamic release material.

According to an embodiment, the blister forming layer comprises a stack of a dynamic release layer deposited on the donor substrate, and a non-vaporizing layer deposited on the dynamic release layer.

According to an embodiment, the blister forming layer comprises a patterned dynamic release layer, the patterned dynamic release layer comprising a patch of a dynamic release material, located on the donor substrate at a location within or overlapping the contact area, and a non-vaporizing layer on the patch, and the at least one indentation is present in the non-vaporizing layer and/or the at least one reinforcing element is present on the non-vaporizing layer.

According to an embodiment, the shape of the pulsed laser beam is adapted to one or more of the following: the shape of the component, the shape of the contact area, the number and/or position (location) of the indentations and/or of the reinforcing elements.

The disclosure is further related to a substrate for use in a method. The substrate can comprise a donor substrate and a blister forming layer on the donor substrate, wherein the blister forming layer is provided with at least one indentation in the surface of the blister forming layer opposite to the surface by which the blister forming layer is attached to the donor substrate. i.e., in the surface opposite to the surface facing he donor substrate, the at least one indentation being configured for predefining the location of at least one nozzle within the contact area between a component and the blister forming layer, wherein the component is to be attached to the donor substrate by adhering the component to the blister forming layer with the contact area between the component and the blister forming layer overlaying the at least one indentation.

According to an embodiment, the substrate further comprises at least one reinforcing element on the surface of the blister forming layer opposite the surface by which the blister-forming layer is attached to the donor substrate. i.e., to the surface of the blister forming layer opposite the surface facing the donor substrate, and the at least one reinforcing element comprises an open area and reinforcing material around the open area, the at least one reinforcing element being configured for predefining the location of at least one nozzle within the contact area between a component and the blister forming layer, wherein the component is to be attached to the donor substrate by adhering the component to the blister forming layer with the contact area overlaying the at least one reinforcing element, such that predefined location of the at least one nozzle corresponds to the location of the open area.

The disclosure is further related to a substrate for use in a method. The substrate can comprise a donor substrate and a blister forming layer on the donor substrate, wherein at least one reinforcing element is present on the surface of the blister forming layer opposite the surface by which the blister forming layer is attached to the donor substrate, i.e., opposite the surface facing the donor substrate, and wherein the at least one reinforcing element comprises an open area and reinforcing material around the open area, the at least one reinforcing element being configured for predefining a location of at least one nozzle within the contact area between a component and the blister forming layer, wherein the component is to be attached to the donor substrate by adhering the component to the blister forming layer with the contact area overlaying the at least one reinforcing element, such that the predefined location of the at least one nozzle corresponds to the location of the open area.

According to an embodiment, the blister forming layer comprises a patterned dynamic release layer, the patterned dynamic release layer comprising a patch of a dynamic release material, located on the donor substrate, and a non-vaporizing layer on the patch, and wherein the at least one indentation is present in the non-vaporizing layer in an area overlying the patch and/or the at least one reinforcing element is present in the non-vaporizing layer in an area overlaying the patch.

BRIEF DESCRIPTION OF THE FIGURES

FIG. 2a.

FIG. 4a.

FIG. 5a. FIG. 5b. FIG. 5c. FIG. 5d, and FIG. 5e illustrate an example embodiment, wherein the location of the nozzle is defined by the presence of a local indentation in the blister forming layer, wherein the blister forming layer is a dynamic release layer.

FIG. 6a.

FIG. 7a.

FIG. 8a.

FIG. 9a.

FIG. 10a.

FIG. 11a.

DETAILED DESCRIPTION

Figure 1:
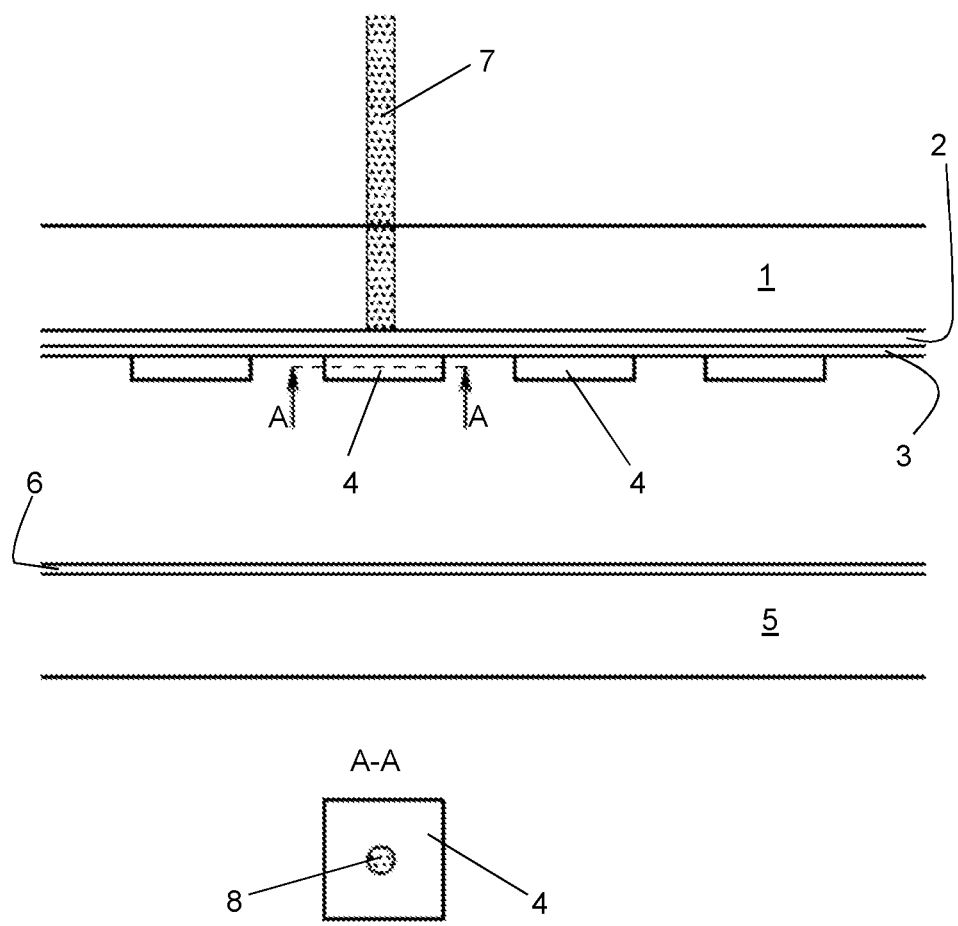
FIG. 1 illustrates a setup comprising a donor substrate with several components attached to it and a receiver substrate onto which the components are to be positioned, with a laser beam directed to the back side of the donor substrate, in accordance with an example embodiment.

Before going into detail about the various embodiments for creating a nozzle at a predefined location, the context and general outline of an example method is explained with reference to FIG. 1 and FIG. 2a to FIG. 2c. FIG. 1 shows a donor substrate 1, for example a glass wafer, with a blister forming layer 2 on a surface of the donor substrate and an adhesive layer 3 on blister forming layer 2. Various embodiments of the blister forming layer 2 will be further described. The adhesive layer 3 may be omitted if the blister forming layer 2 itself has the required adhesive properties for attaching components.

Attached to the adhesive layer 3 is an array of components 4, which may for example be micro-sized chips 4 having a square shaped cross-section with a lateral dimension of about 100 μm. Although the example embodiments can provide for transferring components of this size and lower, the example embodiments are not limited thereto. The components 4 may have various shapes and dimensions. For example, square or rectangular chips may be used with lateral dimensions ranging between a few tens of micrometers to hundreds of micrometers or more. The thickness may be up to 50 μm or even 100 μm or more.

The method can provide for transferring the components (e.g., chips) to a receiver substrate 5 provided, e.g., mounted, such that it faces the donor substrate. The receiver substrate 5 comprises an adhesive layer 6 to which the chips 4 will adhere when they are transferred. Any adhesive layer 6 that is applicable in existing LIFT techniques can be used here. The adhesive layer 6 may be a patterned layer, for example comprising adhesive material only at the locations where the chips 4 are to be received. The receiver substrate 5 may be a substrate to which the chips 4 are to be permanently attached, or a carrier substrate to which the chips are to be temporarily attached. The donor substrate 1 and the receiver substrate 5 can be aligned with respect to each other and possibly maintained at a given distance by one or more spacers (not shown) or by using motorized stages to which the donor substrate and the receiver substrate are respectively attached, so as to create an air gap between the two substrates, as generally known from existing LIFT-based techniques.

A laser beam 7 is directed at one of the chips 4 from the back side of the donor substrate 1. i.e., from the side of the donor substrate opposite to the side where the chips 4 are located. i.e., from the side of the donor substrate 1 opposite to the side facing the receiver substrate 5. In other words, the laser beam 7 is directed such that it has a footprint on the donor substrate at the location of the chip. i.e., at a location within the contact area between the component and the blister forming layer. In the context of the present disclosure, the footprint of the laser beam is defined as the projection of the laser beam on the donor substrate. The laser beam can be a pulsed laser beam. According to an embodiment, a single laser pulse (single pulsed laser beam) is applied for releasing the chip. However, it is also possible to apply several laser pulses (several pulsed laser beams) per chip. In the example shown, the laser beam is directed at a spot 8 at the center of the initial contact area between the chip 4 that is to be irradiated and the blister forming layer 2 (hereafter "the contact area"). The spot thus corresponds to the footprint of the laser beam. Geometrical centrality is however not required and the position of the spot 8 may vary according to different embodiments, as will be further described.

At the initial moment of impact of the laser beam, as illustrated in FIG. 1, the contact area (the initial contact area) corresponds to the full area of the chip 4. The location of the spot 8, as well as the size and shape of the laser beam 7 may vary according to different embodiments, as will be explained further.

Figure 2A:
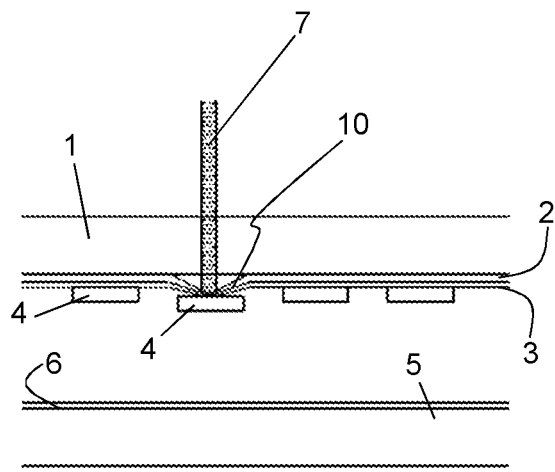
Figure 2B:
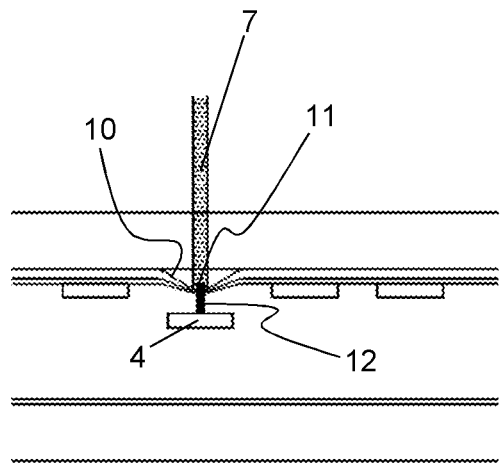
FIG. 2b, and FIG. 2c illustrate the creation of a blister with the setup of FIG. 1, the formation of a nozzle and a jet of vaporized material propelling a component towards the receiver substrate, and the positioning of the component on the receiver substrate.
Figure 2C:
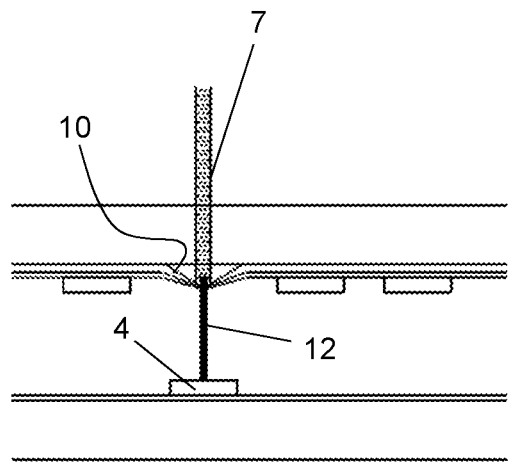

As illustrated in FIG. 2a, at least a portion of the blister forming layer 2 is vaporized by the interaction with the laser beam, and the vapour causes the formation of a blister 10 that is inflated by the pressure of the vapour. As the blister 10 is inflated, the sides of the chip 4 are released from the adhesive layer 3/blister forming layer 2, due to the curvature of the blister 10, so that the contact area between the chip 4 and the adhesive layer 3/blister forming layer 2 becomes smaller compared to the initial contact area at the initial moment of impact of the laser beam (illustrated in FIG. 1). As illustrated in FIG. 2b, the blister 10 continues to inflate until a small opening. i.e., a nozzle 11 is created, resulting in the release of a small, narrow jet 12 of vaporized material. The jet 12 releases the chip 4 from the blister forming layer in the remaining contact area and propels the chip 4 towards the receiver substrate 5, where it is attached to the adhesive receiving layer 6 present on the receiver substrate 5 (FIG. 2c). The jet 12 is narrow as compared to the contact area, which enhances the thrust force in the direction of the receiver substrate 5 relative to drag forces working in the transverse direction. The narrow jet 12 can improve the directionality of the chip 4 during its transfer to the receiver substrate 5, and hence obtaining a minimum deviation from the desired location at which the chip 4 is to land on the receiver substrate 5. i.e., hence obtaining accurate positioning of the chip 4 on the receiver substrate 5.

According to the disclosure, the nozzle 11 can be formed at a predefined location within the contact area. Different ways are possible for defining the location of the nozzle, in accordance with different respective example embodiments, described hereafter. In each of the embodiments described in FIG. 3 to FIG. 11, the chips 4 are attached to the blister forming layer 2 by an adhesive layer 3. The descriptions of these embodiments are valid also when the blister forming layer is itself adhesive, wherein the adhesive layer 3 may be omitted.

Figure 3A:
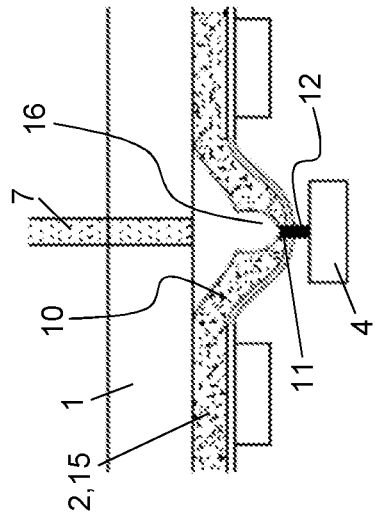
FIG. 3a, FIG. 3b, and FIG. 3c illustrate an example embodiment, wherein the location of the nozzle is defined by the application of a laser beam having a cross section that is smaller than the contact area between the component and the blister forming layer, wherein the blister forming layer is a dynamic release layer.
Figure 3B:
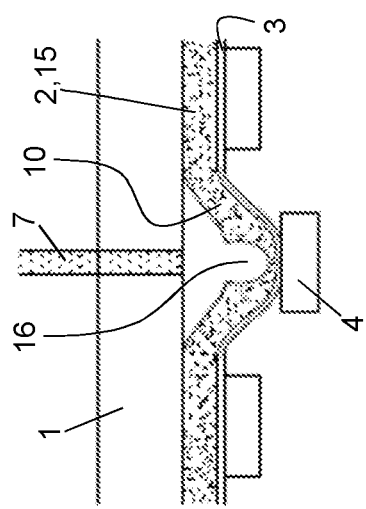
Figure 3C:
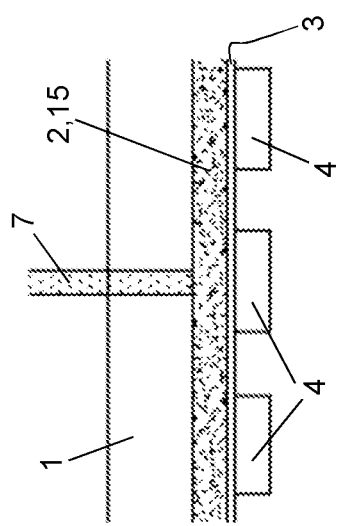

Aspects of an example embodiment are illustrated in FIG. 3a to FIG. 3c. In the example shown the blister-forming layer 2 is a so-called dynamic release layer or DRL 15. i.e., a single layer of dynamic release material, possibly extending across the full area of the donor substrate 1, in any case across an area that is large compared to the contact area. Within the context of this description, a dynamic release material is defined as a material that can be vaporized through the interaction between the material and a laser beam impinging on the material. Well-known examples of dynamic release materials are non-transparent or not fully transparent to the laser light of the impinging laser beam 7, but these materials have the property of absorbing the laser light to the point where the material is vaporized, thereby forming a gas of vaporized material, at the location of impact of the laser beam. Materials of this type are known from the above-described LIFT techniques. A suitable material is for example polyimide 2610 produced by HD MicroSystems™. Materials which are transparent to the laser light may nevertheless be vaporized by a laser when the laser has specific properties. For example, when one or more very short and highly focused laser pulses are applied (pulses with a duration in the order of femtoseconds), some materials may undergo multiphoton absorption, causing the material to be vaporized. This phenomenon is known as such, as well as the laser properties required to realize it. Within the context of this description, a material that is vaporized in this way is therefore also defined as a dynamic release material, and a layer of this material is a dynamic release layer.

The chips 4 are attached to the DRL 15 through the adhesive layer 3 which may for example be a BCB (benzocyclobutene) layer. According to the embodiment illustrated in FIG. 3a to FIG. 3c, the diameter of the laser beam 7 is small relative to the initial contact area between the chip 4 and the dynamic release layer 2 and adhesive layer 3. The spot 8 irradiated by the laser beam (the footprint of the laser beam) is located near the center of the initial contact area (as shown in FIG. 1). When a single narrow laser beam 7 is applied for producing a single nozzle 11 for transferring a single component 4, the spot 8 can be located in line with the center of gravity of the component that is to be transferred. In many cases, this corresponds to the center of the contact area, as schematically illustrated in the drawings. However, if a chip or other component has a shape or weight distribution that is not uniform, the beam 7 may be deliberately directed at an out-of-center spot within the contact area.

As illustrated in FIG. 3b, the laser beam 7 causes the vaporization of the DRL 15 to occur locally at a central vaporized area 16 within the contact area, created upon impact of the laser beam. This leads to the creation of a blister 10 containing vaporized material of the DRL. As the blister 10 then inflates (expands), a nozzle 11 is formed at the location of this central area 16, as illustrated in FIG. 3c, such that the a jet 12 of vaporized material is produced by vaporized material exiting the blister 10 via the nozzle 11, causing release of the chip 4, such that the chip is propelled towards the receiver substrate 5 by the jet 12.

In accordance with any of the example embodiments, the laser beam 7 can be a Gaussian beam. i.e., a monochromatic beam whose amplitude envelope in the transverse plane is determined by a Gaussian function. The diameter of a Gaussian beam is defined within the present context as the width corresponding to the full width at half maximum of the amplitude (FWHM). The laser beam may also be a windowed flat-top' beam, whose amplitude profile is flat. The diameter of the beam is then defined essentially equal to the width of the amplitude profile. For example, for rectangular chips 4 with lateral dimensions of 90 µm×130 µm and thickness 80 µm, a Gaussian beam having a diameter of about 30 µm, wavelength 355 nanometers (nm), and a pulse energy of about 9 micro Joules (µJ) is appropriate in accordance with this example embodiment, in combination with a DRL 15 in the form of a polyimide film having a thickness between 1 and 3 µm, for example 1.4 µm, and a very thin adhesive layer 3. In combination with a polyimide DRL 15 of 1 µm to 3 µm thickness, a BCB adhesive 3 with a thickness of less than 500 nm is suitable for placing chips 4 of the size indicated above, for example applying an air gap between the donor substrate and the receiver substrate of about 200 µm (i.e., about 120 µm between the chip 4 and the receiver substrate).

Figure 4A:
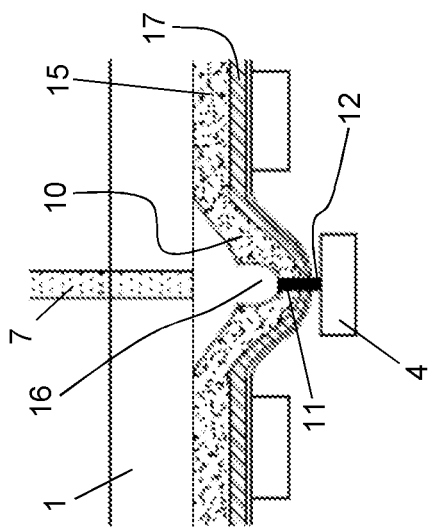
Figure 4B:
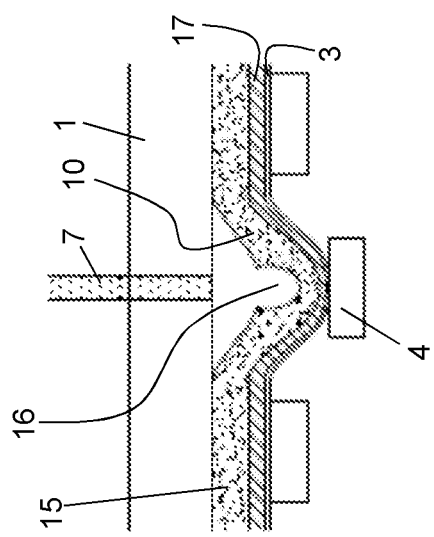
FIG. 4b, and FIG. 4c illustrate an example embodiment, wherein the location of the nozzle is defined by the application of a laser beam having a cross section that is smaller than the contact area between the component and the blister forming layer, wherein the blister forming layer is composed of a dynamic release layer and a non-vaporizing layer.
Figure 4C:
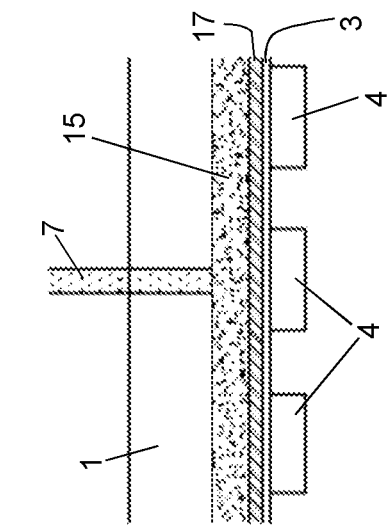

FIG. 4a to FIG. 4c illustrate an exemplary embodiment wherein the diameter of the laser beam 7 defines the location of the nozzle 11, as in the example shown in FIG. 3a to FIG. 3c, but wherein the blister forming layer 2 is a stack of a DRL 15 and a non-vaporizing layer 17 that has suitable properties for forming a blister in terms of its elasticity and thickness, but that itself does not react with the laser beam 7. i.e., the material of this non-vaporizing layer 17 is not vaporized by the laser light. In this embodiment, the vaporized area 16 is formed by the local vaporization of the DRL 15, and as shown in FIG. 4c, the nozzle 11 is formed by an opening created through the non-vaporizing layer 17 at the location of the vaporized area 16. The nozzle 11 is formed at this location, because the local vaporization of the DRL 15 in vaporized area 16 creates a weak spot of the complete blister forming layer 2 at this location. The non-vaporizing layer 17 may for example be a layer of PDMS (polydimethylsiloxane), which is transparent to laser light of wavelength 355 nm and may thus be combined with a polyimide DRL layer 15 when laser light at this wavelength is used. Alternatively, the non-vaporizing layer 17 may itself be a polyimide layer that is transparent to a laser light at another wavelength, for example 1063 nm, when laser light at this different wavelength is used, in combination with a DRL 15 that is vaporized at this wavelength.

According to other exemplary embodiments, the location of the nozzle 11 is defined by a structural feature of the blister forming layer 2, integrated in this layer prior to the application of the laser beam 7. A first example of such an embodiment is illustrated in FIG. 5a to FIG. 5c. In the example shown, the blister forming layer 2 is a DRL 15, with a local indentation 20 formed in the DRL 15, near the center of the contact area between the blister forming layer 2 and the chips 4, in the surface of the DRL 15 opposite the side attached to the donor substrate 1. i.e., opposite the surface facing the donor substrate 1. The local indentation 20 thus forms an area wherein the DRL 15 is locally thinner. This locally thinner area may have a circular cross section as seen in the plane section view included in FIG. 5a, but other cross sections or shapes of the indentation 20 are possible. In the example shown, the adhesive layer 3 is interrupted in this area, but it may also fill the volume of the indentation 20, as further illustrated. In the plane of the DRL's surface, the indentation 20 is small relative to the lateral dimensions of the chip 4. For example, the indentation 20 may have a diameter in this plane of about 30-40 µm if the chip's lateral dimensions are 90 µm×130 µm. The indentation 20 may be located out-of-center of the contact area, for example when the center of gravity of the chip 4 is not in line with the center of the contact area.

In the embodiment illustrated in FIG. 5a to FIG. 5c the laser beam 7 may be a beam having a small diameter relative to the contact area. The laser beam may be directed at the location of the indentation 20, as is the case in FIG. 5a. As illustrated in FIG. 5b and FIG. 5c, local vaporization of the DRL 15 occurs, as described above, and a nozzle 11 is formed at the location of the indentation 20, which coincides with local vaporization area 16. In this case, the local indentation 20 creates a more pronounced weak spot at the desired nozzle location, decreasing the risk that the nozzle would form at another spot, due to irregular blister growth or other factors. The laser beam 7 may also have a larger diameter, for example a diameter in the order of the chip's size, as illustrated in FIG. 5d. Also, in this case the nozzle 11 is formed at the location of the indentation 20, because this local indentation creates a weak spot in the blister forming layer 2 at the desired nozzle location. Therefore, according to this embodiment, the indentation 20 determines the location where the nozzle 11 is formed, regardless of whether the laser beam is narrow or wide.

The indentation 20 shown in FIG. 5a to FIG. 5d is referred to in the present context as a 'point-type' indentation, defined as a small, narrowly localized indentation that gives rise to a point-type nozzle 11 and a line-type jet 12. i.e., a narrow stream of gas issuing from a small point-type location of the blister 10. The nozzle may however also be a line-shaped nozzle, which can be achieved by creating a line-shaped indentation in the DRL 15. FIG. 5e illustrates an embodiment wherein the indentation 20 is shaped as a circular line (a ring). Hence the nozzle 11 is a line-type nozzle formed along the circumference of the ring, and the jet 12 is a sheet-type jet issued from the circular nozzle 11.

According to an embodiment, when the contact area between the component 4 and the donor substrate 1 has an irregular shape, for example an asymmetrical shape, a line-type nozzle may be created that replicates, fully or partially and on a smaller scale, the irregular shape of the contact area, for example in a central portion of the contact area. For this purpose, a line-type indentation 20 having the irregular shape is produced in the blister-forming layer prior to attaching the component to the donor substrate. In this way, the sheet-type jet may be adapted to the shape of the contact area.

Figure 6C:
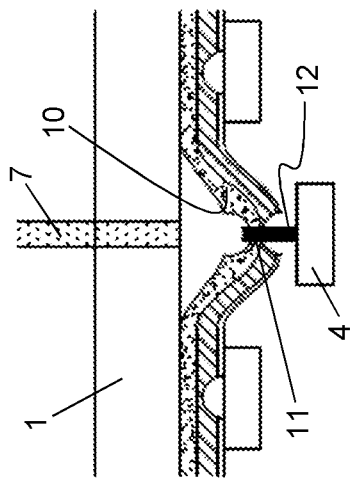
FIG. 6b, and FIG. 6c illustrate an example embodiment, wherein the location of the nozzle is defined by the presence of a local indentation in the blister forming layer, wherein the blister forming layer is composed of a dynamic release layer and a non-vaporizing layer.
Figure 6B:
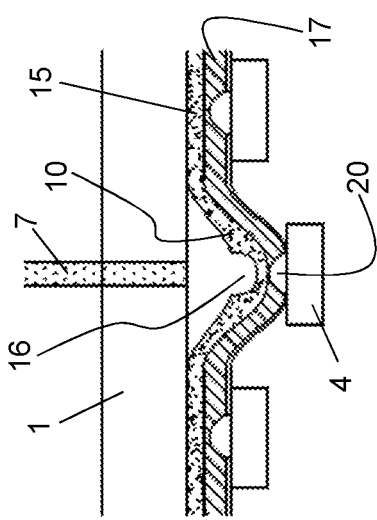
Figure 6A:
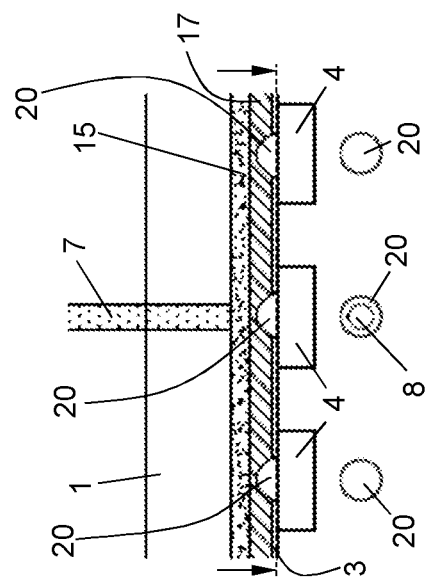

FIG. 6a to FIG. 6c illustrate another example of an embodiment wherein the location where the nozzle 11 is formed is defined by the presence of a local indentation in the blister forming layer. In this example the blister forming layer 2 is a stack of a DRL 15 and a non-vaporizing layer 17, and the indentations 20 are formed in the non-vaporizing layer 17. The indentations 20 may also reach down to the DRL 15, passing through the complete thickness of the non-vaporizing layer 17.

Figure 7A:
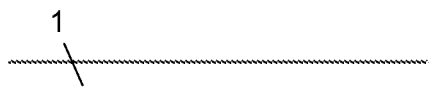
Figure 7B:
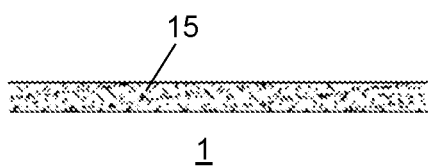
FIG. 7b.
Figure 7C:
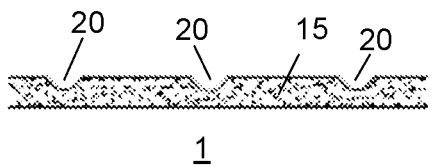
FIG. 7c, and FIG. 7d illustrate an example method for producing a substrate for use in a method as for example illustrated in FIG. 5a to FIG. 5b, wherein a blister forming layer is provided on a donor substrate, the blister forming layer being provided with local indentations.
Figure 7D:
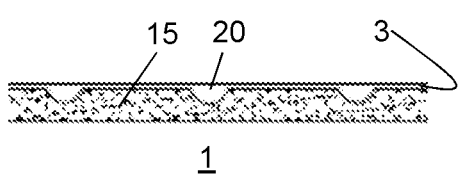
Figure 7E:
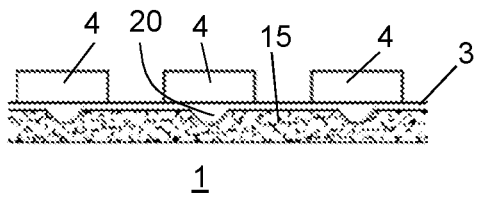
FIG. 7e illustrates attaching components to the substrate shown in FIG. 7d by adhesion to the blister forming layer, with the contact area between the components and the blister forming layer overlaying a local indentation.

For realizing the embodiment of FIG. 5a to FIG. 5c, the indentations 20 are produced in the DRL before the chips 4 are placed thereon. This is illustrated in FIG. 7a to FIG. 7d, which show an exemplary method for producing a substrate for use in such embodiment. As illustrated in FIG. 7a and FIG. 7b, a donor substrate 1 is provided (and can be cleaned), followed by the deposition of a DRL 15. For example, a polyimide DRL 15 may be applied by spin coating. Then the DRL 15 is locally thinned (FIG. 7c), which may be done by a laser treatment or by a lithography and etch step, thus forming the local indentations 20. The adhesive layer 3 is then applied on the DRL15. The adhesive layer may fill the indentations 20, as illustrated in FIG. 7d, or it may partially fill the indentations 20, or it may be applied everywhere on the DRL 15 except in the indentations 20. The presence of a slightly thicker portion of the adhesive layer in the indentations 20 will not prohibit the formation of a nozzle 11 further in the process. FIG. 7e illustrates attaching components (chips) 4 to the substrate of FIG. 7d by adhesion to the blister forming layer 2, with the contact area between the components and the blister forming layer overlaying a local indentation 20. For this embodiment, each of the chips 4 can be aligned to the location of an indentation 20 (e.g., aligned such that the indentation corresponds to the center of the contact area between the chip 4 and the adhesive layer 3). However, as described above, depending on the center of gravity of the chip, the location of the indentation 20 relative to the chip 4 may be deliberately chosen in an out-of-center spot of the contact area.

Figure 8A:
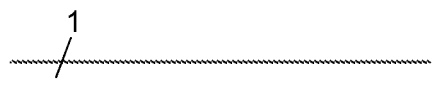
Figure 8B:
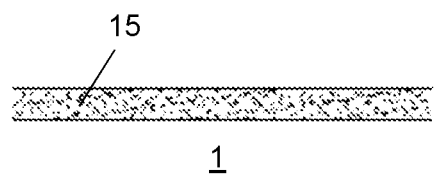
FIG. 8b.
Figure 8C:
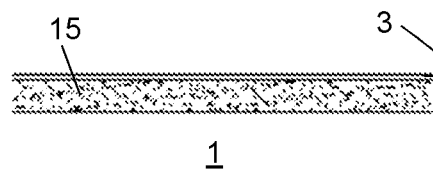
FIG. 8c, and FIG. 8d illustrate an alternative example method for producing a substrate for use in a method as for example illustrated in FIG. 5a to FIG. 5b, wherein a blister forming layer is provided on a donor substrate, the blister forming layer being provided with local indentations.
Figure 8D:
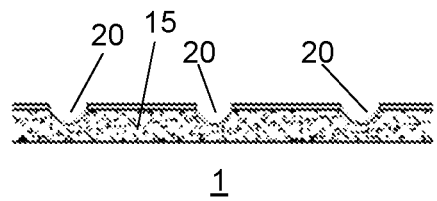
Figure 8E:
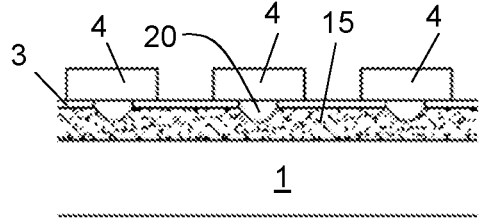
FIG. 8e illustrates attaching components to the substrate shown in FIG. 8d by adhesion to the blister forming layer, with the contact area between the components and the blister forming layer overlaying a local indentation.

Alternatively, as illustrated in FIG. 8a to FIG. 8c, the adhesive layer 3 is applied first on the DRL 15 (FIG. 8c) and the local indentations 20 are formed thereafter (FIG. 8d), such that the adhesive layer 3 is automatically removed from the DRL 15 in the area where the local indentations 20 are formed.

Possible methods for preparing the donor substrate 1 to thereby produce a substrate for use in a method as illustrated in FIG. 6a to FIG. 6c are similar to the methods illustrated in FIG. 7a to FIG. 7d and in FIG. 8a to FIG. 8d, but with the non-vaporizing layer 17 being patterned to form the indentations 20 therein, while the DRL 15 itself remains intact.

Figure 9A:
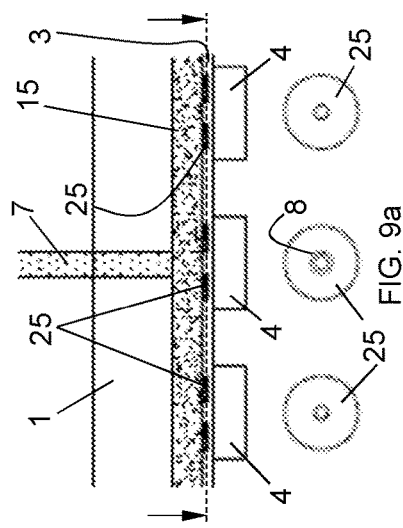
Figure 9B:
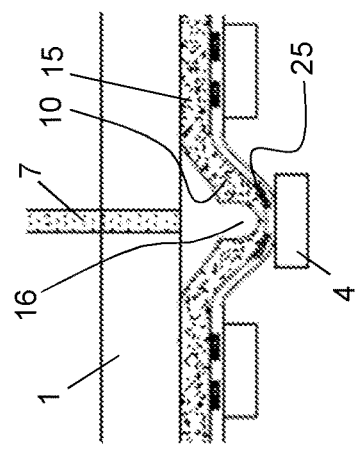
FIG. 9b.
Figure 9C:
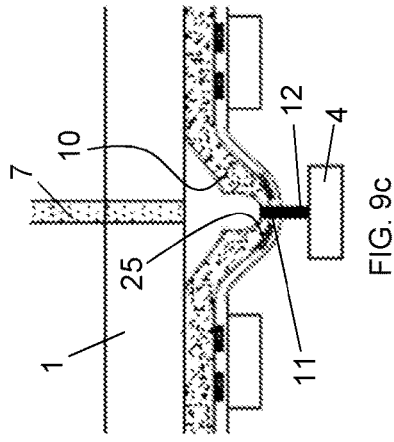
FIG. 9c, and FIG. 9d illustrate an example embodiment, wherein the location of the nozzle is defined by the location of an open area of a reinforcing element formed on the blister forming layer, wherein the blister forming layer is a dynamic release layer.
Figure 9D:
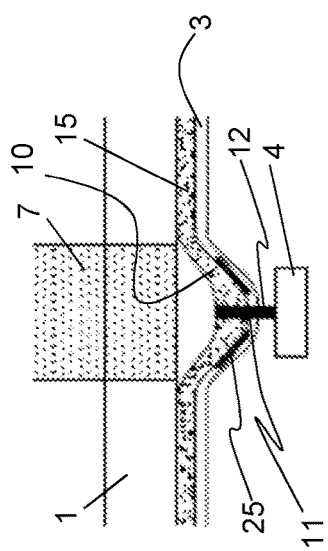

According to a further embodiment, the location of the nozzle is defined by the presence of (the location of) a local reinforcing element on the blister forming layer 2. An example of such an embodiment is illustrated in FIG. 9a to FIG. 9d, wherein the blister forming layer 2 is a dynamic release layer 15. Within the contact area between the chips 4 and the blister forming layer 2 (DRL 15), a ring-shaped reinforcing element 25 is present on the DRL 15, on the surface of the DRL opposite to the surface facing the donor substrate 1. The ring-shaped reinforcing element 25 is a patterned layer of reinforcing material comprising an open area its center (central opening) and a layer of reinforcing material around the open area. In the example shown the laser beam 7 is directed to the central opening of the ring-shaped reinforcing element. The nozzle is then created at a spot 8 (shown in sectional view A-A in FIG. 1) that is coaxial with the center of this ring-shaped reinforcing element 25. The reinforcing element 25 may be formed of metal or of a polymer with a higher elasticity modulus than the DRL 15. It may be formed by depositing a layer of the metal or polymer (a layer of reinforcing material) on the DRL and patterning the layer by lithography and etching, prior to the formation of the adhesive layer 3. As an alternative to lithography and etching, additive techniques may be used for forming the reinforcing element 25, such as for example printing. As illustrated in FIG. 9a to FIG. 9c, a laser beam 7 having a small diameter relative to the contact area may be used. FIG. 9b and FIG. 9c show the local vaporization of the DRL 15 and the formation of a nozzle 11 at the central open area of the local reinforcing element 25. Compared to the embodiment of FIG. 3a to FIG. 3c, the reinforcing element 25 ensures that the nozzle 11 is formed at a location corresponding to the open area (in the example shown the center) of the reinforcing element 25. Whereas in the case of the embodiment shown in FIG. 3a to FIG. 3c, there may be a risk that the blister 10 could burst outside the desired location due to unstable blister growth or irregular boundary conditions, this risk is substantially prohibited when a reinforcing element 25 is applied. This reinforcing element 25 keeps the blister 10 substantially intact around the location where the nozzle 11 is to be created. As illustrated in FIG. 9d, the laser beam 7 may also have a larger diameter, for example a diameter in the order of the size of the components 4. The reinforcing element 25 is somewhat larger than the footprint of the laser, ensuring that the nozzle 11 is formed in the open area at its center rather than at any other location of the expanding blister 10. Also in this case the nozzle is formed at the location of the open area of the reinforcing element 25. Thus, when providing a reinforcing element 25 as described above, the location of the nozzle is defined by the location of the open area, regardless of whether the laser beam is narrow or wide.

Figure 10A:
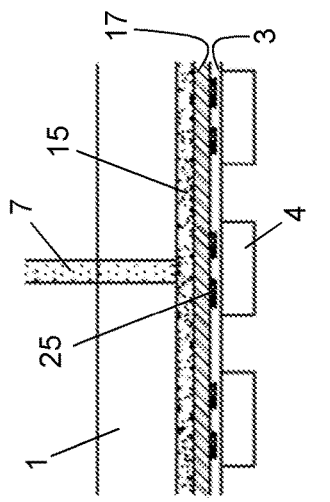
Figure 10B:
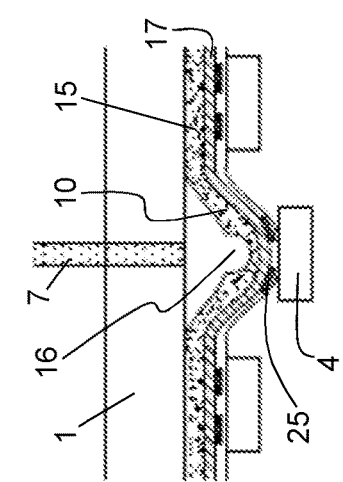
FIG. 10b, and FIG. 10c illustrate an example embodiment, wherein the location of the nozzle is defined by the location of an open area of a reinforcing element formed on the blister forming layer, wherein the blister forming layer is composed of a dynamic release layer and a non-vaporizing layer.
Figure 10C:
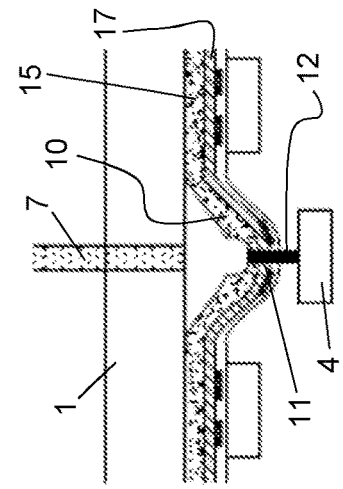

FIG. 10a to FIG. 10c illustrate an embodiment wherein the location of the nozzle is defined by the location of an open area of a reinforcing element 25 formed on a blister forming layer 2, wherein the blister forming layer 2 is a stack of a DRL 15 and a non-vaporizing layer 17 on the DRL 15.

The shape and dimensions of the reinforcing element 25 are not limited to the ring-shape shown in the drawings. The reinforcing element 25 at least has an open area that determines the location of the nozzle, but the surrounding material (patterned layer of reinforcing material) of the reinforcing element may have any suitable shape and/or any suitable dimensions. The patterned layer of reinforcing material can have has a closed circular or polygonal shape, but a non-closed shape such as a non-closed ring formed of separate strips may also have the desired effect. Example characteristics in terms of the shape or size of the reinforcing element may depend on the thickness and composition of the blister forming layer, the laser wavelength and/or laser power, or other parameters of the method. The reinforcing element 25 may be have an open area located in the center of the contact area, or it can have an open area located out-of-center relative to the contact area, for example as a function of the location of the center of gravity of the component to be transferred.

The reinforcing element 25 may also be combined with a local indentation 20 in the DRL 15 or in the non-vaporizing layer 17. In this case, the local indentation 20 and the reinforcing element 25 are provided coaxially with respect to each other. When the indentation 20 is line-shaped as for example illustrated in FIG. 5e, the reinforcing element 25 may comprise two strips of reinforcing material, placed on either side of the indentation 20.

Figure 11C:
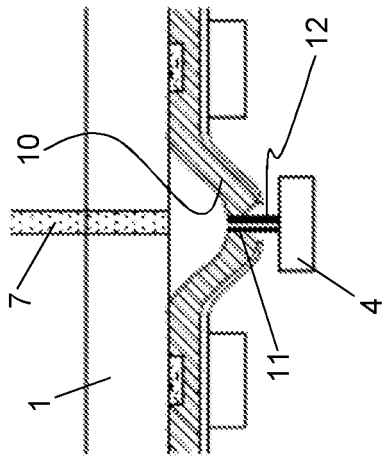
FIG. 11b, and FIG. 11c illustrate an example embodiment, wherein the location of the nozzle is defined by the presence of a local indentation in the blister forming layer, and wherein the blister forming layer comprises a patterned dynamic release layer.
Figure 11B:
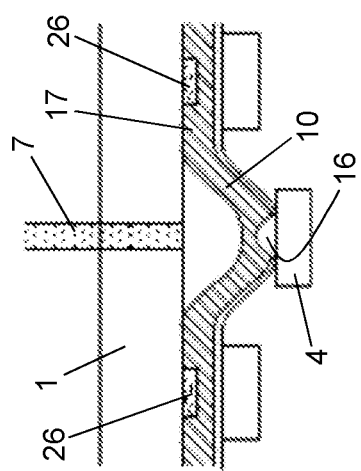
Figure 11A:
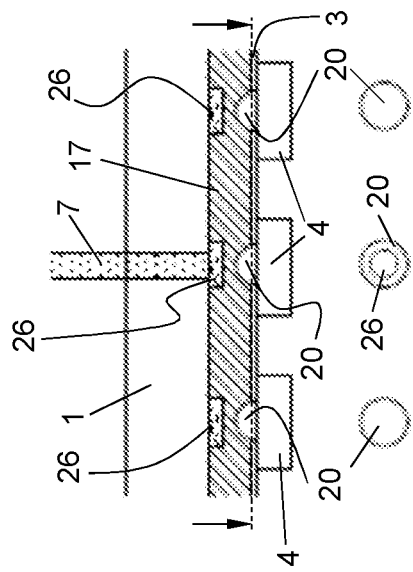

According to a further embodiment illustrated in FIG. 11a to FIG. 11c, the DRL itself is patterned such that a local patch 26 of dynamic release material is present in at least part of the contact area with each chip 4. This may be achieved by providing a DRL 15 on the entire surface of the donor substrate 1 (as in FIG. 7b and FIG. 8b), followed by patterning this layer by lithography and etching. The patches 26 may have a round shape as illustrated in the plane section view included in FIG. 11a, but other shapes are possible as well. On the donor substrate 1 and on these patches 26 of DRL material is a non-vaporizing layer 17, provided with local indentations 20, the local indentations 20 being placed more or less concentrically with respect to the patches 26, and with the chips 4 mounted about concentrically with respect to the local indentations 20. In this embodiment the blister-forming layer 2 comprises the patches 26 of dynamic release material and the non-vaporizing layer 17. The laser beam 7 then causes vaporization of substantially the complete patch 26 of DRL material, and the local indentation 20 defines the location of the nozzle 11, as illustrated in FIG. 11b and FIG. 11c. The laser diameter may be larger, as the indentation 20 defines the location of the nozzle 11, irrespective of the size of the footprint of the laser. This embodiment is useful as it provides a better control over the amount of dynamic release material that interacts with the laser, so that the risk of uncontrolled blister formation and breaking of the blister at a non-desired location is reduced. The patches 26 of dynamic release material may also be applied in combination with reinforcing elements 25 as described above, and with the combined application of local indentations 20 and reinforcing elements 25 (i.e., patches 26, local indentations 20 and reinforcing elements 25 combined in one embodiment).

Figure 12:
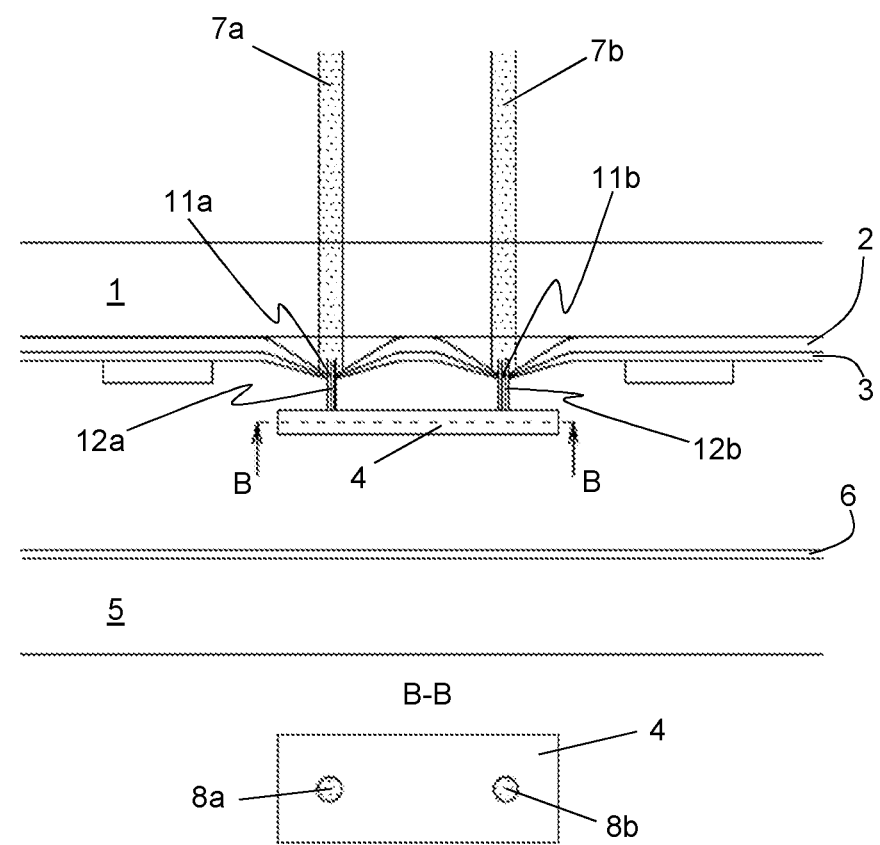
FIG. 12 illustrates an example embodiment, wherein multiple laser beams are directed to a single component.

According to other embodiments, more than one nozzle is formed in the contact area between the blister forming layer and a component to be placed and the donor substrate. Such an embodiment is illustrated in FIG. 12, showing an example wherein two nozzles are created within the contact area of a chip 4 with a rectangular cross-section. The nozzles are created by directing two laser beams 7a and 7b simultaneously to spots 8a and 8b respectively (shown in sectional view B-B in FIG. 12), located within the contact area between the chip 4 and the adhesive layer 3 present on the blister-forming layer 2. The laser beams may be obtained by splitting a single laser beam. The nozzles are distributed evenly across the initial contact area, so that multiple blisters 10a and 10b are formed, resulting in multiple nozzles 11a and 11b and multiple jets 12a and 12b which propel the chip 4 towards the receiver substrate 5. This embodiment can be applied for any component shape, using as many lasers as required as a function of the dimensions of the contact area between the component and the donor substrate. The nozzle locations may be defined according to any one of the embodiments described with respect to FIG. 3 to FIG. 11. This embodiment is not only useful for transferring larger components, but also for transferring components with irregular. e.g., asymmetrical shapes of the contact area, or components which have a fragile structure at their center (for example, a microlens), so that the nozzles may be placed at regular distances around the fragile structure.

Figure 13:
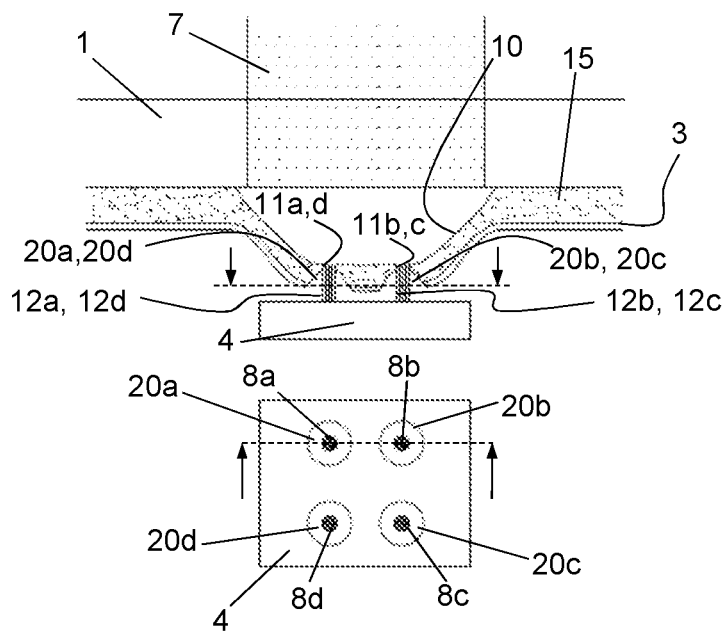
FIG. 13 illustrates an example embodiment, wherein a single laser beam is used for creating four nozzles within the contact area of a single component, wherein the location of each of the nozzles is defined by the presence of a point-type local indentation in the blister forming layer, resulting in four line-shaped jets of vaporized material.

According to a further embodiment illustrated in FIG. 13, a single laser 7 is applied to a relatively large chip 4, and multiple nozzles are created for propelling the chip towards the receiver substrate. This embodiment can use a broad laser beam 7, for example a laser beam having a footprint in the order of the initial contact area between the component 4 and the dynamic release layer, combined with multiple local indentations and/or multiple reinforcing elements, which define the location of the nozzles. In the example shown in FIG. 13, four local indentations 20a. 20b. 20c, and 20d are arranged in a square pattern. The laser beam creates a blister 10 which gives rise to the more or less simultaneous formation of four nozzles 11a. 11b. 11c, and 11d, after which four jets 12a. 12b. 12c, and 12d propel the chip 4 towards the receiver substrate 5. This embodiment is not only useful for transferring relatively large components, but also for transferring components with irregular shapes of the contact area, or components which have a fragile structure at their center, so that the nozzles may be placed at a distance from the fragile structure. e.g., at equal distances around the fragile structure.

Figure 14:
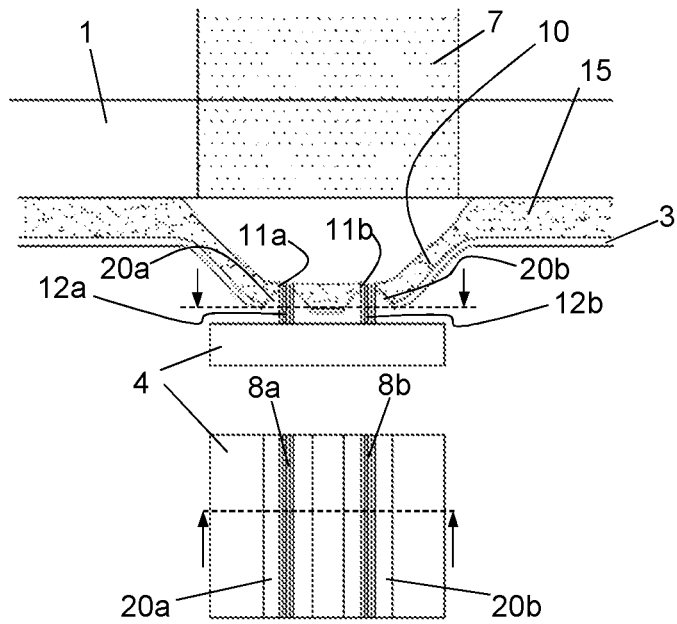
FIG. 14 illustrates an example embodiment, wherein a single laser beam is used for creating two nozzles within the contact area of a single component, wherein the location of each of the nozzles is defined by the presence of a line-type local indentation in the blister forming layer, resulting in two sheet-shaped jets of vaporized material.

FIG. 14 illustrates an example wherein two indentations 20a and 20b are used, both having the shape of a straight line, from one end of the chip 4 to the other and placed symmetrically with respect to the center of the chip 4. This results in the formation of two line-type nozzles 11a and 11b, and two straight sheet-type jets 12a and 12b which propel the chip towards the receiver substrate 5.

In any of the above-described embodiments, a number of parameters can pertain to the embodiments such as the dimensions of the indentations 20 and/or the reinforcing elements 25, the thickness of the DRL 15 and (if present) the non-vaporizing layer 17, the material of these layers, the type and thickness of the adhesive layer 3 (if present). These parameters may differ as a function of the size and shape of the components 4 that are to be transferred, the applied laser power, the laser diameter etc. The parameters can therefore dependent on the specific case in terms especially of the component type and dimensions. The parameter selection can be performed by the skilled person on the basis of a reasonable number of trials. One example of suitable parameters in the context of the embodiment of FIG. 5 has been given above. The spot 8 to which the laser beam 7 is directed has a circular shape in embodiments of the present disclosure described above and illustrated in the drawings (for example FIG. 5a. FIG. 6a), due to the circular shape (as seen in cross-section) of the laser beam 7 and the circular shape of its footprint on the donor substrate. Other shapes of the footprint of the laser beam 7 and hence other shapes of the spot 8 are possible, however. The shape of the laser beam may be adapted to the shape of the component and/or of the contact area, or to the number and position of the indentations and/or the reinforcing elements. For example, by using a cylindrical lens, a circular laser spot can be shaped into an elliptical laser spot, resulting in an elliptical footprint on the donor substrate, thereby providing a better overlap with a rectangular chip to be transferred (for example for an embodiment according to FIG. 3 or FIG. 4), by orienting the elliptical spot with its largest dimension in the length direction of the chip. Also, when a rectangular chip 4 is to be transferred from a donor substrate 1 provided with multiple indentations 20 and/or reinforcing elements 25 in the contact area with the chip, as for example illustrated in FIG. 13, the laser beam 7 can be shaped so as to overlap more closely the locations of the indentations and/or reinforcing elements, which in some cases, can be beneficial as compared to a circular spot. For example, a circular spot overlapping a row of two or more indentations 20 provided in the length direction of a rectangular chip 4, needs to have a large diameter, resulting in a blister that is oversized in the transverse direction (perpendicular to the length direction), which threatens to impact adjacent chips unless the chips are placed at a sufficiently large distance from each other in the transverse direction. When the footprint of the laser is shaped to have an elliptical shape extending in the length direction of the chip, the blister is shaped according to the elliptical shape, and chips can be placed closer to each other on the donor substrate.

Figure 15:
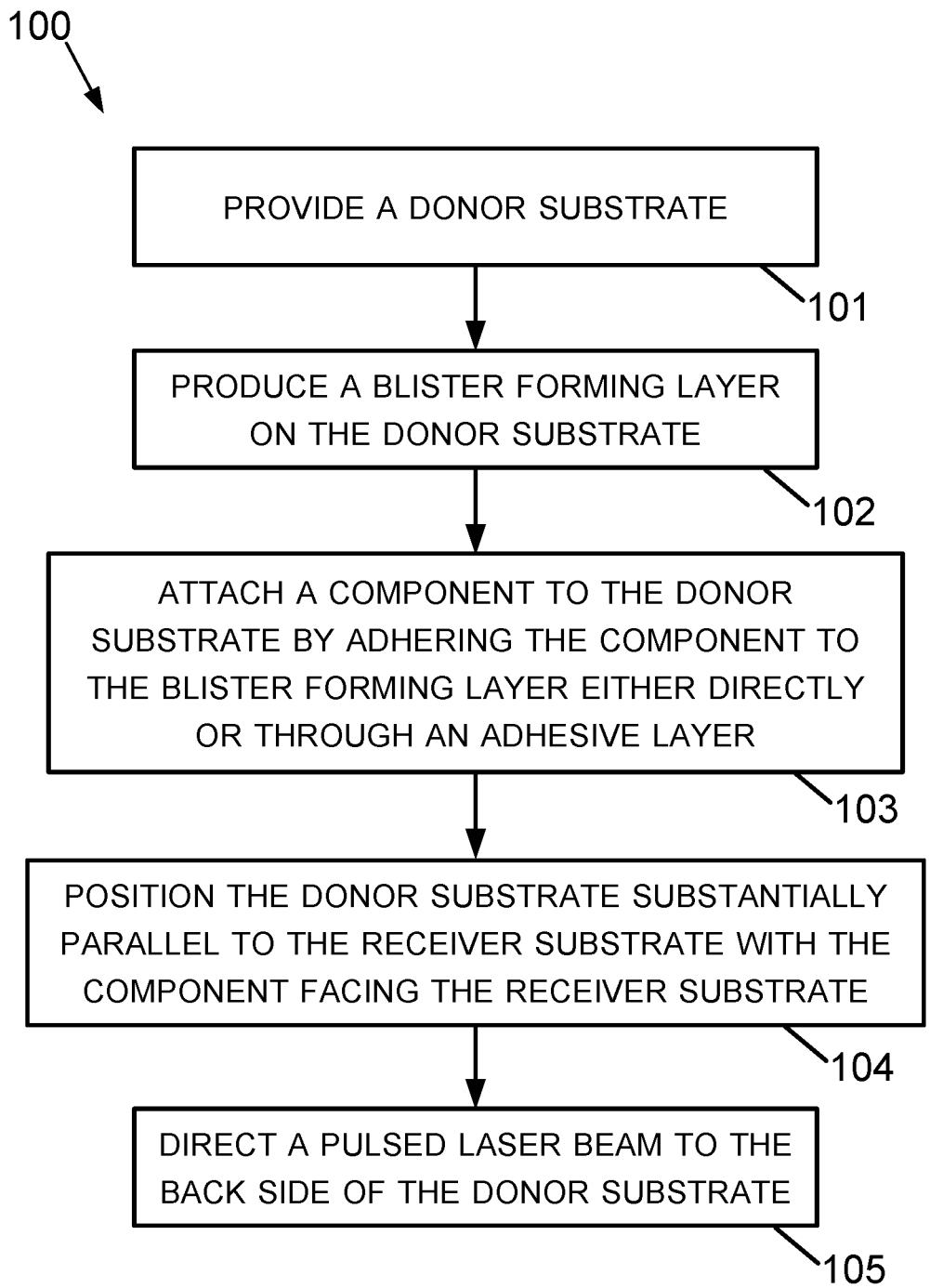
FIG. 15 is a flowchart pertaining to the method, in accordance with an exemplary embodiment.

Next, FIG. 15 is a flowchart 100 pertaining to the method for positioning a component, such as a micro-component, on a receiver substrate. Block 101 includes providing a donor substrate. Next, block 102 includes producing a blister forming layer on the donor substrate. The blister forming layer can be a single layer or a stack of sublayers. The blister forming layer can comprise at least a dynamic release layer. Next, block 103 includes attaching the component to the donor substrate by adhering the component to the blister forming layer either directly or through an adhesive layer. The component is in direct contact with the blister forming layer or via the adhesive layer across a contact area. The contact area can cover the whole or a portion of the dynamic release layer. Next, block 104 includes positioning the donor substrate substantially parallel to the receiver substrate, with the component facing the receiver substrate. The receiver substrate can comprise on its surface facing the donor substrate an adhesive receiving layer. Next, block 105 includes directing a pulsed laser beam to the back side of the donor substrate (i.e., to the side of the donor substrate facing away from the receiver substrate) with a footprint of the pulsed laser beam at the location of the component (i.e., at a location within the contact area between the component and the blister forming layer). The pulsed laser beam causes vaporization of at least part of the dynamic release layer, thereby creating a blister containing vaporized material of the dynamic release layer (vaporized dynamic release material). The blister can expand until at least one nozzle is created at a predefined location within the contact area. The at least one nozzle allows the vaporized dynamic release material to exit the blister, thereby producing a jet of vaporized material, and causes the release of the component and its propulsion towards the receiver substrate. As a result, the component is positioned on the receiver substrate and attached to the receiver substrate by adhesion to the adhesive receiving layer.

The method of the example embodiment(s) allows to achieve placement of a large number of components at high throughput rates, as the laser can be displaced quickly from one component to a next one when a plurality of small components attached to the donor substrate is to be transferred to a receiver substrate. Throughput rates of several hundred to tens of thousands of components per second are achievable.

The method is applicable for example for assembly of micro-LED displays by placing micro-LEDs for which Red. Green, and Blue micro-LEDs need to be transferred from a III-V source wafer to a thin-film transistor display backplane, wherein the micro-LEDs are first transferred from the source wafer to the donor substrate by a suitable known transfer method before their transfer from the donor substrate to a receiver substrate. The method is also applicable for placing of chiplets. e.g., for fan-out wafer level packaging. The method is further applicable for placing of small components with fragile surfaces, such as optical components or micro-lenses. The method is further applicable for placing of small quantities of material such as solder paste or glue, for electrically interconnecting small components as mentioned in (1) to (3).

While various aspects have been illustrated and described in detail in the drawings and foregoing description, such illustration and description are to be considered illustrative or exemplary and not restrictive. Other variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used. Any reference signs in the claims should not be construed as limiting the scope.

The invention claimed is:

1. A method for positioning a component on a receiver substrate, the method comprising:
   providing a donor substrate;
   producing a blister forming layer on the donor substrate, wherein the blister forming layer is a single layer or a stack of sublayers, the blister forming layer comprising at least a dynamic release layer;
   attaching the component to the donor substrate by adhering the component to the blister forming layer either directly or through an adhesive layer, so that the component is in direct contact with the blister forming layer or via the adhesive layer across a contact area, the contact area covering at least a portion of the dynamic release layer;
   positioning the donor substrate substantially parallel to the receiver substrate, with the component facing the receiver substrate, the receiver substrate comprising on its surface facing the donor substrate an adhesive receiving layer; and
   directing a pulsed laser beam to a side of the donor substrate facing away from the receiver substrate, with a footprint of the pulsed laser beam at a location within the contact area between the component and the blister forming layer, the pulsed laser beam causing vaporization of at least part of the dynamic release layer, thereby creating a blister containing vaporized material of the dynamic release layer, wherein the blister expands until at least one nozzle is created at a predefined location within the contact area, the at least one nozzle allowing the vaporized material of the dynamic release layer to exit the blister, thereby producing a jet of vaporized material and causing a release of the component and its propulsion towards the receiver substrate, thereby positioning the component on the receiver substrate and attaching the component to the receiver substrate by adhesion to the adhesive receiving layer.

2. The method according to claim 1, wherein the predefined location within the contact area is defined by applying a pulsed laser beam having a cross section that is considerably smaller than the contact area, and directing the pulsed laser beam at a spot within the contact area, so that the at least one nozzle is created at a position of the spot.

3. The method according to claim 1,
wherein the predefined location within the contact area is defined by a location of at least one indentation in the blister forming layer or in a surface of the blister forming layer opposite a surface of the blister forming layer facing the donor substrate, and
wherein the at least one indentation is positioned within the contact area.

4. The method according to claim 3,
wherein at least one indentation is a point-type indentation, resulting in at least one nozzle producing a line-shaped jet of vaporized material, or
wherein at least one indentation is a line-type indentation, resulting in at least one nozzle producing a sheet-shaped jet of vaporized material.

5. The method according to claim 1,
wherein the predefined location within the contact area is defined by the location of at least one reinforcing element present on a surface of the blister forming layer opposite a surface of the blister forming layer facing the donor substrate, and
wherein the at least one reinforcing element comprises an open area and reinforcing material around the open area, so that the predefined location of the at least one nozzle corresponds to a location of the open area.

6. The method according to claim 5, wherein at least one reinforcing element is a plate-shaped element formed of a reinforcing material, obtainable by depositing a layer of the reinforcing material on the blister forming layer and patterning the layer of reinforcing material, before attaching the component to the donor substrate.

7. The method according to claim 6, wherein the reinforcing material is a metal.

8. The method according to claim 1, wherein the blister forming layer is a dynamic release layer consisting of dynamic release material.

9. The method according to claim 1, wherein the blister forming layer comprises a stack of a dynamic release layer on the donor substrate, and a non-vaporizing layer on the dynamic release layer.

10. The method according to claim 3, wherein the blister forming layer comprises a patterned dynamic release layer, the patterned dynamic release layer comprising a patch of a dynamic release material, located on the donor substrate at a location within or overlapping the contact area, and a non-vaporizing layer on the patch, and wherein the at least one indentation is present in the non-vaporizing layer.

11. The method according to claim 1, wherein a shape of the pulsed laser beam is adapted to one or more from among:
a shape of the component,
a shape of the contact area, or
a number of indentations.

12. A substrate for use in the method according to claim 1, the substrate comprising:
a donor substrate and a blister forming layer on the donor substrate,
wherein the blister forming layer is provided with at least one indentation in a surface opposite a surface facing the donor substrate, the at least one indentation being configured for predefining a location of at least one nozzle within a contact area between a component and the blister forming layer, and
wherein the component is to be attached to the donor substrate by adhering the component to the blister forming layer with the contact area overlaying the at least one indentation.

13. The substrate according to claim 12, further comprising:
at least one reinforcing element on the surface of the blister forming layer opposite the surface facing the donor substrate, the at least one reinforcing element comprising an open area and reinforcing material around the open area, the at least one reinforcing element being configured for predefining a location of at least one nozzle within the contact area between a component and the blister forming layer,
wherein the component is to be attached to the donor substrate by adhering the component to the blister forming layer with the contact area overlaying the at least one reinforcing element.

14. A substrate for use in the method according to claim 1, the substrate comprising:
a donor substrate and a blister forming layer on the donor substrate,
wherein at least one reinforcing element is present on a surface of the blister forming layer opposite the surface facing the donor substrate, and
wherein the at least one reinforcing element comprises an open area and reinforcing material around the open area, the at least one reinforcing element being configured for predefining a location of at least one nozzle within a contact area between a component and the blister forming layer, wherein the component is to be attached to the donor substrate by adhering the component to the blister forming layer with the contact area overlaying the at least one reinforcing element.

15. The substrate according to claim 12, wherein the blister forming layer comprises a patterned dynamic release layer, the patterned dynamic release layer comprising a patch of a dynamic release material, located on the donor substrate and a non-vaporizing layer on the patch, and wherein the at least one indentation is present in the non-vaporizing layer in an area overlaying the patch and/or wherein the at least one reinforcing element is present in the non-vaporizing layer in an area overlaying the patch.

16. The method according to claim 3, wherein a shape of the pulsed laser beam is adapted to one or more from among:
a shape of the component,
a shape of the contact area,
a number of indentations, or
the location of at least one indentation.

17. The method according to claim 5, wherein a shape of the pulsed laser beam is adapted to one or more from among:
- a shape of the component,
- a shape of the contact area,
- a number of indentations,
- a number of reinforcing elements, or
- the location of at least one reinforcing element.

18. The method according to claim 5, wherein:
- the blister forming layer comprises a patterned dynamic release layer,
- the patterned dynamic release layer comprises a patch of a dynamic release material, located on the donor substrate at a location within or overlapping the contact area, and a non-vaporizing layer on the patch, and
- the at least one reinforcing element is present on the non-vaporizing layer.

19. The method according to claim 6, wherein:
- the blister forming layer comprises a patterned dynamic release layer,
- the patterned dynamic release layer comprises a patch of a dynamic release material, located on the donor substrate at a location within or overlapping the contact area, and a non-vaporizing layer on the patch, and
- the at least one reinforcing element is present on the non-vaporizing layer.

20. The method according to claim 2, wherein a shape of the pulsed laser beam is adapted to one or more from among:
- a shape of the component,
- a shape of the contact area, or
- a number of indentations.

21. The method according to claim 1, wherein the at least one nozzle includes multiple nozzles generated at respective locations within the contact area.

22. The method according to claim 1, wherein:
- the at least one nozzle includes a single nozzle created at the predefined location within the contact area, and
- the predefined location corresponds to a center of gravity of the component that is to be positioned.

\* \* \* \* \*